(12) United States Patent
Honma et al.

(10) Patent No.: US 7,551,485 B2
(45) Date of Patent: Jun. 23, 2009

(54) SEMICONDUCTOR MEMORY DEVICE

(75) Inventors: Mitsuaki Honma, Yokohama (JP);
Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/106,892

(22) Filed: Apr. 21, 2008

(65) Prior Publication Data

US 2008/0198659 A1  Aug. 21, 2008

Related U.S. Application Data

(63) Continuation of application No. 11/352,363, filed on Feb. 13, 2006, now Pat. No. 7,362,623.

(30) Foreign Application Priority Data

Mar. 28, 2005  (JP) .............................. 2005-090860

(51) Int. Cl.
*G11C 16/06* (2006.01)
(52) U.S. Cl. ..................... 365/185.21; 365/185.12; 365/189.09; 365/189.06; 365/207
(58) Field of Classification Search ............ 365/189.07, 365/185.21, 205, 207, 185.12, 189.09, 189.06, 365/185.03, 185.17
See application file for complete search history.

(56) References Cited

U.S. PATENT DOCUMENTS

| 5,841,711 | A | * | 11/1998 | Watanabe .................... 365/200 |
| 6,072,719 | A | | 6/2000 | Tanzawa et al. |
| 6,487,122 | B2 | | 11/2002 | Shibata et al. |
| 6,496,412 | B1 | | 12/2002 | Shibata et al. |
| 6,552,943 | B1 | * | 4/2003 | Hardee ....................... 365/205 |
| 6,636,998 | B1 | | 10/2003 | Lee et al. |
| 6,707,719 | B2 | | 3/2004 | Shibata et al. |
| 6,809,964 | B2 | | 10/2004 | Moschopoulos et al. |
| 6,859,379 | B2 | | 2/2005 | Sakui |
| 7,206,241 | B2 | | 4/2007 | Kido et al. |
| 2004/0205429 | A1 | | 10/2004 | Yoshida et al. |

FOREIGN PATENT DOCUMENTS

| JP | 2000-195280 | 7/2000 |
| JP | 2001-93288 | 4/2001 |

* cited by examiner

*Primary Examiner*—David Lam
(74) *Attorney, Agent, or Firm*—Oblon, Spivak, McClelland, Maier & Neustadt, P.C.

(57) ABSTRACT

A semiconductor memory device includes: a memory cell array having a plurality of memory cells arranged therein; and a sense amplifier circuit configured to read data of the memory cell array, wherein a comparison operation is performed between read out data from the memory cell array and externally supplied expectance data in the sense amplifier circuit.

5 Claims, 12 Drawing Sheets

FIG. 7

| | SDC | | | PDC | | | TDC | | | DDCA | | | DDCB | | | |
|---|---|---|---|---|---|---|---|---|---|---|---|---|---|---|---|---|
| a1 | 0 | 1 | 1 | | | | | | | | | | | | | |
| a2 | 0 | | | | | | 0 | 0 | 1 | | | | | | | SDC→TDC |
| a3 | | | | 0 | 1 | 0 | 0 | 0 | 1 | | | | | | | PDC→DDCA |
| a4 | | | | 0 | 1 | 1 | | | | 0 | 1 | 0 | | | | TDC→PDC |
| a5 | | | | | | | 0 | 0 | 1 | | | | | | | TDC-DDCA→TDC |
| a6 | | | | 0 | 1 | 0 | | | | | | | 0 | 0 | 1 | PDC→DDCB |
| a7 | | | | | | | 0 | 1 | 0 | | | | | | | TDC→PDC |
| a8 | | | | | | | 0 | 1 | 1 | 0 | 1 | 0 | | | | DDCA→TDC |
| a9 | | | | | | | 0 | 1 | 0 | | | | 0 | 1 | 1 | TDC-DDCB→TDC |
| a10 | | | | 0 | 1 | 1 | | | | 0 | 0 | 0 | | | | PDC→DDCA |
| a11 | | | | | | | 0 | 1 | 1 | | | | | | | TDC+DDCA→TDC |
| a12 | 0 | 1 | 1 | | | | 0 | | | | | | | | | TDC→SDC |

SEMICONDUCTOR MEMORY DEVICE

CROSS-REFERENCE TO RELATED APPLICATION

This application is a continuation of and claims the benefit of priority from U.S. application Ser. No. 11/352,363, now U.S. Pat. No. 7,362,623, filed on Feb. 13, 2006, and is based on and claims the benefit of priority from the prior Japanese Patent Application No. 2005-090860, filed on Mar. 28, 2005, the entire contents of which are incorporated herein by reference.

BACKGROUND OF THE INVENTION

1. Field of the Invention

This invention relates to a semiconductor memory device, specifically relates to an error-detecting function thereof.

2. Description of Related Art

A NAND-type flash memory is known as one of EEPROMs (Electrically Erasable and Programmable ROMs). In a NAND-type flash memory, the memory cell array is formed of NAND cell units, each of which has plural memory cells connected in series. Since the unit cell area of the NAND cell unit is smaller than that of NOR-type cell array, it is easy to increase the memory capacitance.

Recently, to achieve a flash memory with a larger capacitance, there have been provided various multi-value storage schemes, in which one memory cell stores multi bits (for example, refer to Unexamined Japanese Patent Application Publication No. 2001-93288).

Further, to assure the reliability of a flash memory, there has been provided a technique for combining an ECC circuit with the memory (for example, refer to Unexamined Japanese Patent Application Publication No. 2002-251884).

A flash memory with a four-value data storage scheme has in general a smaller data margin (i.e., threshold distribution difference) in comparison with one of a binary data storage scheme because it is in need of setting four threshold voltage distributions. To achieve an eight-value or sixteen-value flash memory, the data margin will be further smaller. Therefore, if an ECC circuit is usually used one that is adaptable for a small number of bit errors, it may be impossible to be adapted to a flash memory with a multi-value data storage scheme.

SUMMARY OF THE INVENTION

According to an aspect of the present invention, there is provided a semiconductor device including:

a memory cell array having a plurality of memory cells arranged therein; and a sense amplifier circuit configured to read data of the memory cell array, wherein a comparison operation is performed between read out data from the memory cell array and externally supplied expectance data in the sense amplifier circuit.

BRIEF DESCRIPTION OF THE DRAWINGS

FIG. 7 shows data changes in the sense unit for explaining the exclusive OR operation in the sense unit.

DETAILED DESCRIPTION OF THE EMBODIMENTS

Illustrative embodiments of this invention will be explained with reference to the accompanying drawings below.

Figure 1:
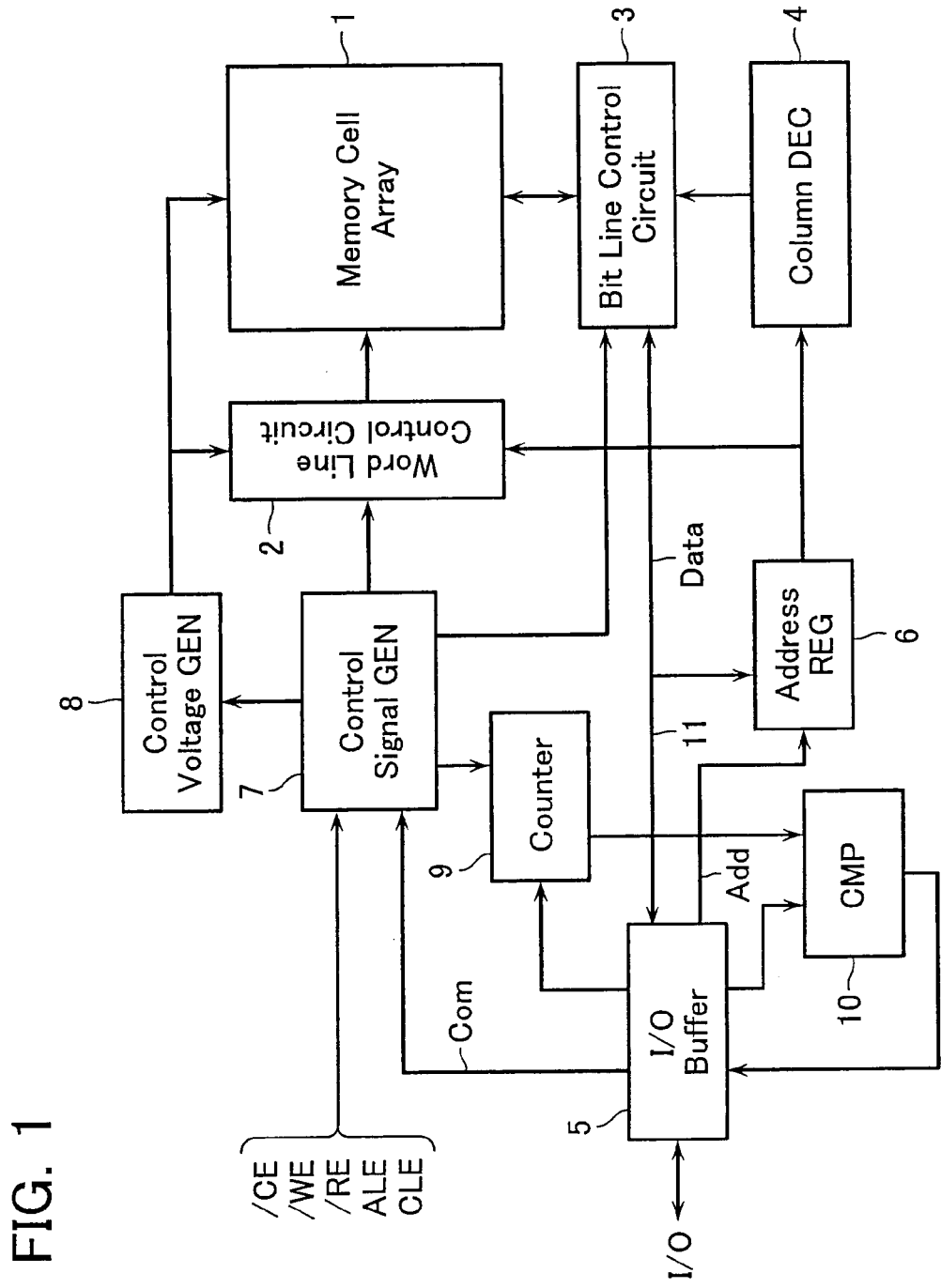
FIG. 1 is a diagram for showing a functional block configuration of a flash memory in accordance with an embodiment of the present invention.
Figure 2:
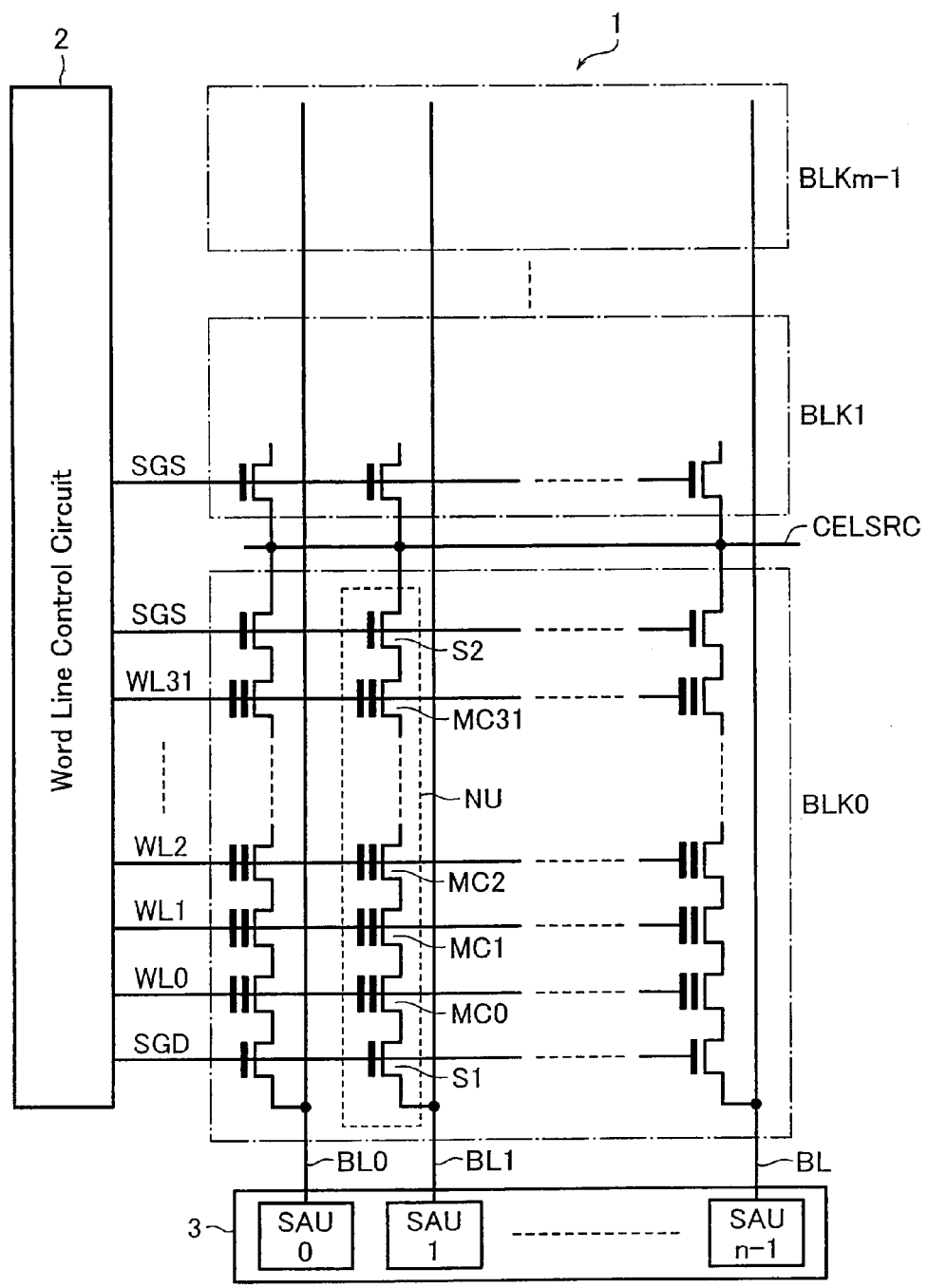
FIG. 2 shows a memory cell array configuration of the flash memory.

FIG. 1 shows a functional block of a NAND-type flash memory in accordance with an embodiment. The memory cell array 1 is, as shown in FIG. 2, formed of NAND cell units NU arranged therein. Each NAND cell unit NU has a plurality of, thirty-two in the example shown in FIG. 2, electrically rewritable and non-volatile memory cells MC0-MC31 connected in series, and select gate transistors S1 and S2 for coupling both ends of the memory cell string to a bit line BL and a source line CELSRC, respectively.

Control gates of the memory cells MC0-MC31 are coupled to different word lines WL0-WL31, respectively. Gates of the select gate transistors S1 and S2 are coupled to select gate lines SGD and SGS disposed in parallel with the word lines.

A set of NAND cell units sharing word lines WL0-WL31 constitutes a block, which serves as a unit of data erase. As shown in FIG. 2, plural blocks (BLK0, BLK1, . . . ) are arranged in general in the direction of the bit line BL.

A word line control circuit 2 includes a row decoder and word line drivers for selecting and driving the word lines. A bit line control circuit 3 is a sense amplifier circuit, which is coupled to the bit lines of the memory cell array 1 for reading data thereof and has a data latch function for holding read out data and write data. A column decoder 4 serves for selecting bit lines of the memory cell array 1.

At a data read time, read out data in the sense amplifier circuit 3 are output via a data bus 11 and I/O buffer 5. At a data write time, write data supplied to the I/O terminals from an external controller are loaded in the sense amplifier circuit 3 via the I/O buffer 5 and the data bus 11.

A command "Com" supplied from the I/O terminals via the I/O buffer 5 is decoded in the control signal generating circuit (i.e., internal controller) 7. Supplied to the controller 7 are a chip enable signal /CE, a write enable signal /WE, a read enable signal /RE, an address latch enable signal ALE, a command latch enable signal CLE and other external control signals. The internal controller 7 controls data write and erase sequences and a data read operation based on the external control signals and commands supplied in accordance with operation modes.

An address "Add" supplied via the I/O terminals I/O and the buffer 5 is transferred to the word line driver circuit 2 and column decoder 4 via an address register 6.

To generate various high voltages higher than the power supply voltage in accordance with operation modes, there is prepared a control voltage generating circuit 8, which is controlled with the controller 7.

In this embodiment, as explained later, it is made possible to detect a write error bit or bits in a page in the chip. For this purpose, the bit line control circuit 3 is formed to be able to do a "comparison operation" (for example, exclusive OR operation, exclusive NOR operation and the like) between the read out data and externally supplied expectance data. To count error bits based on the operation result data, there is prepared a counter 9, which is operable in accordance with a control clock generated from the controller 7.

Further, there is prepared a comparator circuit 10, which compares the count value (i.e., error bit number) output from the counter 9 with an externally supplied permissible value data. The comparator circuit 10 judges whether the error bit number is less than the permissible value or not, and outputs the resultant to the external.

In case the memory cell array is configured as shown in FIG. 2, bit line control circuit (i.e., sense amplifier circuit) 3 has plural sense units SAUi (i=0, 1, n−1). In this case, a set of memory cells arranged in the direction of a word line constitutes a page serving as a unit of data read and write in a binary data storage scheme while it constitutes two pages in a four-value data storage scheme, in which one memory cell stores two bits.

Figure 3:
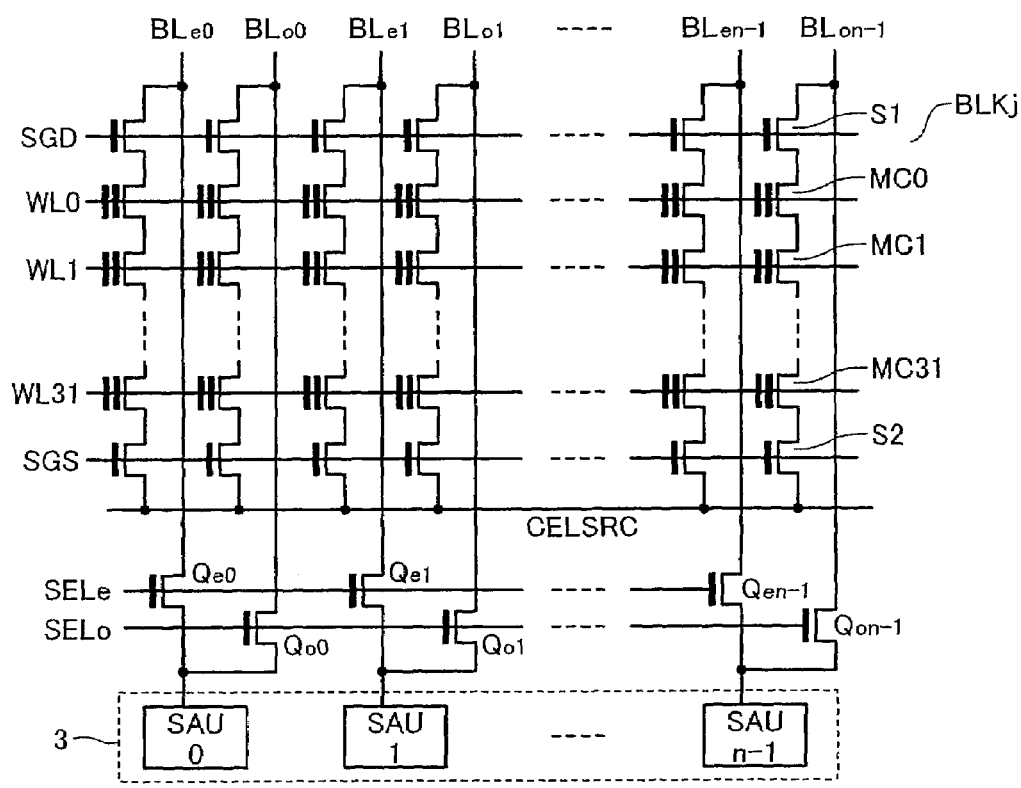
FIG. 3 shows a relationship between the memory cell array and sense amplifier circuit in a shared sense amplifier scheme.

However, in a practical NAND-type flash memory with miniaturized memory cells, it becomes difficult to arrange sense units SAUi for every bit line as shown in FIG. 2. In addition, even if it is possible to dispose the sense units as described above, line-to-line noise between adjacent bit lines becomes influential. In consideration of this situation, it is usually used, as shown in FIG. 3, such a shared sense amplifier scheme that each even numbered bit line BLe and an adjacent odd numbered bit line BLo share a sense unit SAU. In this shared sense amplifier scheme, bit lien select transistors Qe and Qo are disposed between even/odd bit lines and the corresponding sense unit SAUi, so that either one of the even/odd bit lines BLe/BLo is coupled to the sense unit SAUi while the other serves as a shield line.

In case the above-described shared sense amplifier scheme is used, a set of memory cells selected by a word line WL and the entire even numbered bit lines BLe constitute a sector while another set of memory cells selected by the word line and the entire odd numbered bit lines BLo constitute another sector. One sector, in this case, constitutes as a page serving as a unit of data read and write in the binary data storage scheme while it constitutes two pages in the four-value data storage scheme.

Figure 4:
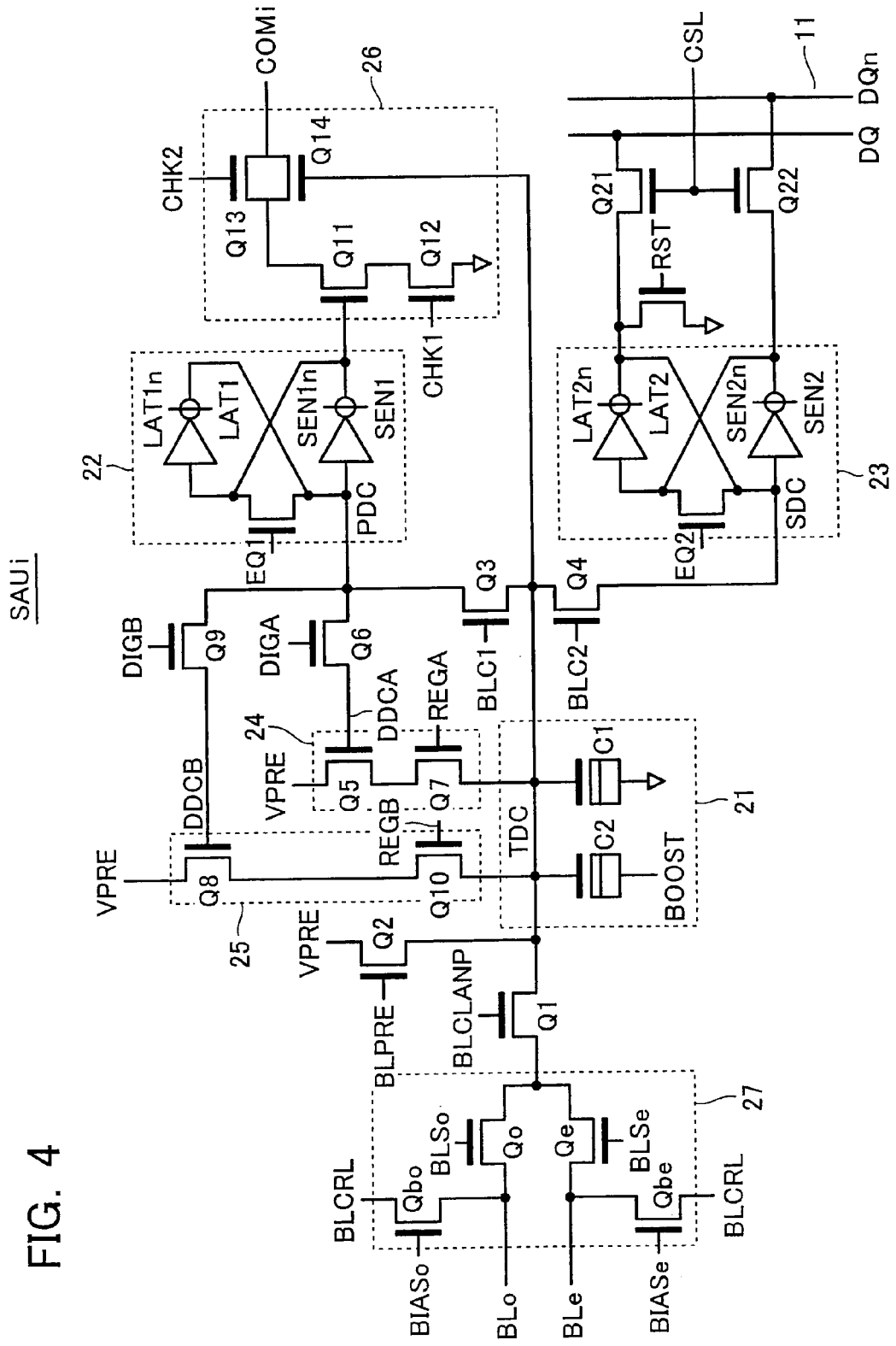
FIG. 4 shows a sense unit configuration in the flash memory.

FIG. 4 shows the detailed configuration of one sense unit SAUi in the sense amplifier circuit 3. Node TDC serves as not only a sense node for sensing the bit line voltage but also a data storage node for temporarily storing data. Therefore, the node TDC constitutes a temporary data storage circuit 21 together with a charge storing capacitor C1 and a boost capacitor C2 coupled to it.

The node TDC is connected to a bit line via a clamping NMOS transistor Q1. In the shared sense amplifier scheme shown in FIG. 3, bit line select circuit 27 is disposed between the clamping transistor Q1 and a pair of bit lines BLe and BLo so that the clamping transistor Q1 is coupled to either one of the bit lines BLe and BLo. The bit line select circuit 27 has select transistors Qe, Qo and biasing transistors Qbe, Qbo for applying a certain bias to a non-selected bit line.

The node TDC is coupled to data storage nodes PDC and SDC of data latches 22 and 23 via transferring NMOS transistors Q3 and Q4, respectively. The data latch 22 is a data storage circuit for storing read data and write data. The data latch 23 is disposed between the data latch 22 and data lines DQ, DQn to serve as a data cache for temporarily storing read data and write data.

Therefore, the nodes of data latch 23 are coupled to data lines DQ and DQn in the data bus 11 via select gate transistors Q21 and Q22 driven by a column select signal CSLi.

In case of a multi-value data storage scheme, to do write-verify control for a currently written page, it is in need of referring to an already written page or a page to be written later. Therefore, for example, the data latches 22 and 23 are used in such a way that the data latch 22 stores page data, which is currently written, while the data latch 23 stores reference page data.

Data write is performed by repeat of write voltage application and write-verify for obtaining a certain data threshold distribution. Write-verify is performed for every bit, and it is in need of determining write data of the following cycle based on the verify result.

The gate of a NMOS transistor Q5, the drain of which is applied with voltage VPRE, serves as a data storage node DDCA, to which write data held at the node PDC is temporarily cached, and stored in a write cycle. Data at the node PDC is transferred to the data storage node DDCA via an NMOS transistor Q6. Voltage VPRE is Vdd or Vss, which is selectively set.

With NMOS transistor Q5, and NMOS transistor Q7 disposed between the data storage node TDC and the transistor Q5, it becomes possible to set data at the data storage node TDC in accordance with data at the node DDCA. In other words, these transistors Q5 and Q7 constitute a write-back circuit 24 for writing-back the following write data to the storage node TDC in a write cycle. This write-back circuit 24 has a function of processing data addition/subtraction between the nodes TDC and DDCA based on the selection of the drain voltage VPRE.

In this embodiment, another write-back circuit 25 is disposed in parallel with the write-back circuit 24. Write data held at the node PDC is transferred to and held in the write-back circuit 25, which is able to write back a certain data to the data storage node TDC. The gate of an NMOS transistor Q8, the drain is applied with voltage VPRE, serves as a data storage node DDCB, to which data at the node PDC is transferable via a transferring NMOS transistor Q9. A transferring NMOS transistor Q10 is disposed between the source of transistor Q8 and the node TDC.

For the conventional write control, it is necessary to use either one of the write-back circuits 24 and 25. The reason of that the two write-back circuits 24 and 25 are disposed in parallel with each other in this embodiment is for the purpose of operation processing in a test mode for error-detecting. As explained later, in the test mode in this embodiment, exclusive OR Boolean operation processing is performed in a lump between a page read data and externally supplied expectance data so as to detect error bits.

A verify-check circuit 26 is connected to the data latch 22. NMOS transistor Q11, the gate of which is coupled to one node of the data latch 22, is a check-use transistor, the source of which is grounded via a NMOS transistor Q12 driven by a check signal CHK1. The drain of transistor Q11 is coupled to a common signal line COMi via parallel-disposed transferring NMOS transistors Q13 and Q14, the gates of which are driven by a check signal CHK2 and data of the node TDC, respectively.

In a write cycle, each verify-check circuit 26 in sense units of one page is turned on after verify-read. If data write has not been completed in a sense unit, the corresponding verify-check circuit 26 discharges the common signal line COMi, which has been preliminarily precharged to "HH". Data latches 22 for one page become an all "1" state, the common signal line COMi is not discharged to be kept in a "H" level state, and it becomes a "Pass" flag, which shows a write completion state.

Figure 5:
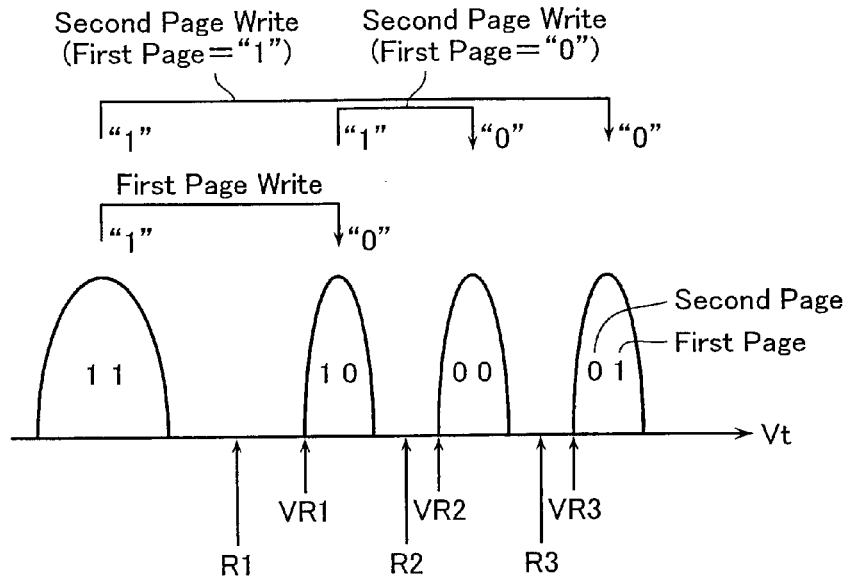
FIG. 5 shows a data bit assignment example of a four-value data storage scheme and data write method thereof.

Although the NAND-type flash memory in this embodiment is able to store binary data, it is desirable to store four-value data. FIG. 5 shows a data bit assignment and data write method in a four-value data storage scheme.

In case of the four-value data storage, one memory cell stores two-bit data. Supposing that a four-value data is expressed as (x,y) (where, "y" is a first page data, i.e., lower page data; and "x" is a second page data, i.e., upper page data), data bits are assigned in such a way that data (11), (10), (00) and (01) are arranged in order of cell's threshold voltage Vt.

Data (11) is the lowest level with a negative threshold voltage as defined as an erase state. Data erase is performed with applying an erase voltage Vera to a p-type well, on which the memory cell array is formed, while applying Vss to the entire word lines in a selected block. With this voltage application, the entire memory cells in the selected block are subjected to electron discharge from the floating gate, thereby being erased.

Data write is performed in principle by repeat of "0", "1" write in case of multi-value data storage scheme and in case of binary data storage scheme. Here, "0" write is performed as an operation for injecting electrons into the cell's floating gate on condition that a selected cell's channel is set at 0V via a bit line in accordance with write data held in the sense unit, and then write voltage Vpgm is applied to a selected word line. With this "0" write operation, the cell's threshold voltage increases.

The channel of a "1" write cell is, prior to the write voltage application, set in a floating state of Vdd-Vt. In this case, when the write voltage Vpgm is applied, the cell's channel is boosted, thereby avoiding electron injection into the floating gate. Therefore, the "1" write cell is kept in the previous threshold state as it is.

In case of four-value data storage scheme, for example, as shown in FIG. 5, it is in need of performing two-page, first and second pages, write operations. The first page write is for selectively increasing the threshold voltage of (11) cells, i.e., erase state cells, to get data (10). In the second page write, cells in data (11) are selectively increased in threshold voltage defining data (01), and at the same time cells in data (10) are selectively increased in threshold voltage defining data (00).

What determine the threshold distributions of the written data (10), (00) and (01) are verify-read voltages VR1, VR2 and VR3, which are set at the lowest values of the threshold distributions, respectively. That is, perform read operations with applying the verify-read voltages to a selected word line, and it may be judged whether "0" data has been sufficiently written or not. Note here that it is in need of performing two verify steps with VR2 and VR3 for verifying the second page write.

Data read is performed as follows: the second page data is read out with a read voltage R2 set between the threshold distributions of data (10) and (00); the first page data are read out with read voltage R1 and R3, which are set between the threshold distributions of data (11) and (10), and (00) and (01), in accordance with the first page data "0" and "1", respectively.

Figure 6:
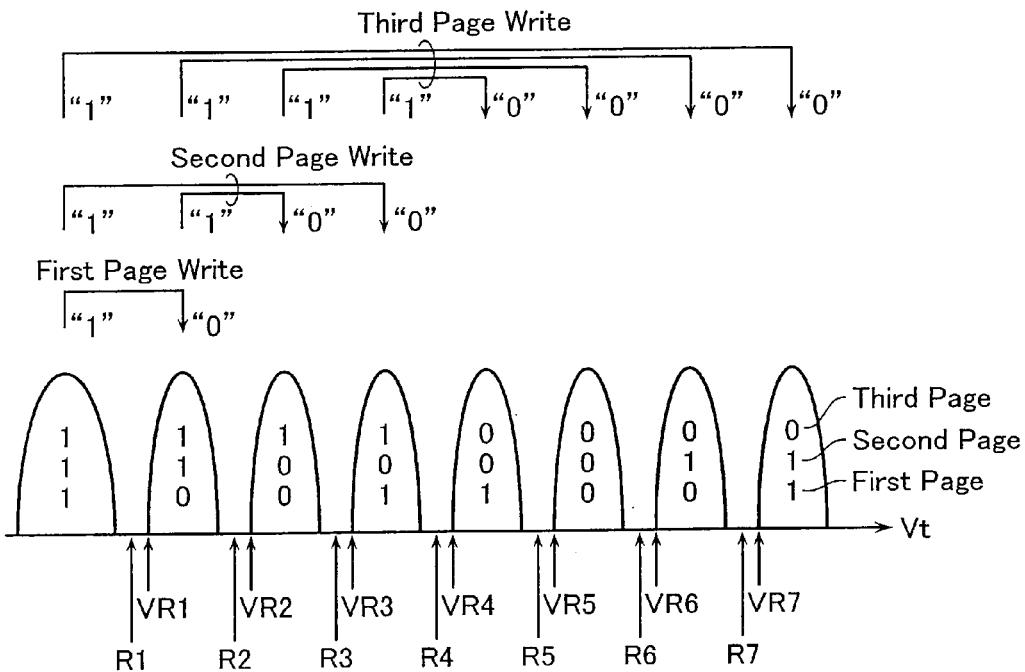
FIG. 6 shows a data bit assignment example of a eight-value data storage scheme and data write method thereof.

FIG. 6 shows data bit assignment and data write method in an example of an eight-value data storage scheme. Although the detailed explanation is omitted, an eight-value data is expressed with three-page data. The write method shown in FIG. 6 is an expansion of that in the four-value data storage scheme shown in FIG. 5.

With first page writing, data (111) cells in an erase state are selectively increased in threshold voltage to data (110). Second page data write is for selectively writing data (100) and (101) into data (111) and (110) cells, respectively. Third page data write is for selectively writing data (001), (000), (010) and (011) into data (111), (110), (100) and (101) cells, respectively. In the above-described data write operations, verify-read voltage VR1-VR7 are used, which are set at the lowest values of the respective threshold distributions.

The third page data is read out with a read voltage R4 set between data (101) and (001); the second page data is read out with read voltages R2 and R6 set between data (110) and (101) and between data (000) and (010), respectively; and the third page data is read out with read voltages R1, R3, R5 and R7 set between data (111) and (100), (100) and (101), (001) and (000), and (010) and (011), respectively.

Next, an error-detecting test mode in this embodiment will be explained in association with the sense unit SAUi shown in FIG. 4 below. With respect to the error-detecting operations described bellow, "H" and "L" levels at the data storage nodes PDC, SDC, TDC, DDCA and DDCB in the sense unit SAUi serve as data "1" and "0", respectively.

To detect errors, one page data read data read out from the cell array 1 to the data latches 22 and one page expectance data supplied from the external to the data latches 23 are subjected to an exclusive OR operation therebetween in a lump.

FIG. 7 shows data changes at the respective data storage nodes during the operation processing performed with respect to four combinations obtainable between the read out data and the expectance data with four-bit data shown in the data storage nodes. Although the data state change explained below is performed with giving attention to only one sense unit SAUi, practical data state changes are simultaneously progressed in plural sense units (i.e., one page sense units) contained in a sense amplifier circuit.

In the initial state "a1" shown at the uppermost column in the table shown in FIG. 7, read out data at the node PDC and expectance data at the node SDC are shown in parallel for the following four combinations: read out data is "0" and expectance data is "0" (first bits at PDC and SDC, respectively); read out data is "0" and expectance data is "1" (second bits at PDC and SDC, respectively); read out data is "1" and expectance data is "0" (third bits at PDC and SDC, respectively); and read out data "1" and expectance data "1" (fourth bits at PDC and SDC).

In the state "a1", first and fourth bits in the four bits shown at node PDC are the same as those of the expectance data at the node SDC, and second and third bits are different from those of the expectance data, i.e., error bits.

Each of the exclusive OR operations for error-detecting is defined by (SDC·PDC)+(PDC·SDC) and achieved with data transferring operations among nodes PDC, SDC, TDC, DDCA and DDCB performed under the control of the controller 7 as follows:

First, the expectance data at the node SDC in the data latch 23 is transferred to node TDC (state "a2"), and the read out data at the node PDC in the data latch 22 is transferred to the node DDCA in the data storage circuit 24 (state "a3"). Whichever of these data transfer operations is advanced is not problematic, and it is also permissible that these data transfer operations are performed simultaneously. Next, data transferred to the node TDC is further transferred to and latched at the node PDC in the data latch 22 (state "a4").

In this state, transistor Q7 in the write-back circuit 24 is turned on with applying a "H" level signal to the gate REGA, and meanwhile the drain voltage VPRE of the memory transistor Q5 is kept at Vss. On this bias condition, in case node DDCA is data "1", node TDC is discharged while in case node DDCA is data "0", node TDC is kept as it is (state "a5").

This means that subtraction defined by (TDC-DDCA) is performed in the write-back circuit 24, and the first subtraction result is obtained at the node TDC. This subtraction corresponds to [expectance data]–[read out data].

Next, the expectance data held at the node PDC in the data latch 22 is transferred to and held at the node DDCB in the data storage circuit 25 (state "a6"), following it the first subtraction data held at node TDC is transferred to and held at the node PDC of the data latch 22 (state "a7"). Further, the read out data held at node DDCA in the write-back circuit 24 is transferred to node TDC with applying Vdd+α to the drain VPRE of transistor Q5 and applying a "H" level signal to the gate REGA of transistor Q7 (state "a8").

In this state, transistor Q8 in the write-back circuit 25 is turned on with applying a "H" level signal to the gate REGB, and meanwhile the drain voltage VPRE of the memory transistor Q8 is kept at Vss. On this bias condition, in case node DDCB is data "1", node TDC is discharged while in case node DDCB is data "0", node TDC is kept as it is (state "a9").

This means that subtraction defined by (TDC-DDCB) is performed in the write-back circuit 25, and the second subtraction result is obtained at the node TDC. This subtraction corresponds to [read out data]–[expectance data].

Next, the first subtraction result data held at node PDC of the data latch 22 is transferred to and held at node DDCA of the data storage circuit 24 (state "a10"). Then, in a state where VPRE=Vdd+α is applied to the drain of transistor Q5, transferring transistor Q7 disposed between transistor Q5 and node TDC is turned on with applying a "H" level signal to the gate REGA.

As a result, if data at node DDCA is "1", node TDC is charged-up to a "H" level (="1"); and if data at node DDCA is "0", node TDC is kept as it is (state "a11").

This means that addition defined by (TDC+DDCA) is performed in the write-back circuit 24, and the addition result, i.e., a result of adding the first subtraction result to the second subtraction result, is obtained at the node TDC.

With the above-described data processing, an exclusive OR operation is executed between the read out data at node PDC of the data latch 22, which is read out at the beginning of the test mode, and the expectance data loaded at node SDC of the data latch 23, and the operation result is obtained. The operation result data held at node TDC is transferred to and held at node SDC of the data latch 23 (state "a12").

The operation result data in each sense unit SAUi defined as follows: "0" data shows that the read out data is identical with the expectance data, thereby being a normal bit; and "1" data shows that the read out data is an error bit. With the above-described data transferring, the practical operations are executed for one page data in a lump in one page sense units, so that it becomes possible to detect error bit(s) in one page read data in a short time.

In this embodiment, input one page final operation results, each of which is obtained at the node SDC of data latch 23, to counter 9, and it may be detected that the number of "1" data is the number of error bits. Further, a permissible value data of the error bits is input from the outside of the chip, and the number of the error bits obtained in the counter 9 is compared with the permissible value data at the comparator 10. The compared result will be output outside of the chip. As a result, the external controller is able to know in a short time whether the number of error bits is over the permissible value or not.

Figure 8:
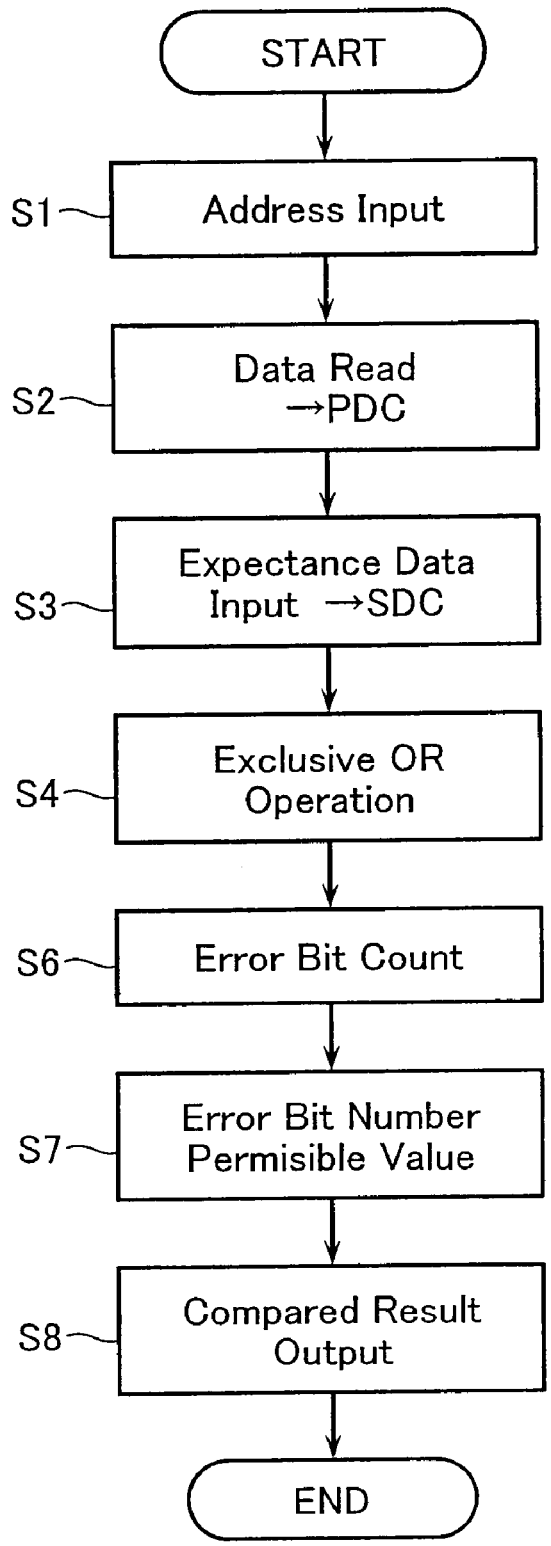
FIG. 8 shows an operation flow of detecting error bits.

FIG. 8 is an operation flow showing the test mode for detecting error bits as described above. Receiving a certain test command, this test mode starts. Following the command input, an address is input for reading a certain page (step S1), and the corresponding page of the cell array is read out. Each of the read out data bits is transferred to and held in the data latch PDC in the sense unit (step S2).

Following it one page expectance data are externally supplied, each of which is loaded in the data latch SDC in the sense unit (step S3). Then, based on the above-described data transferring in the sense units, exclusive OR operations are executed in a lump between the read out data and the expectance data (step S4).

The operation result data each is held at data latch SDC. Count the number of "1" data in the operation result data, and it may be detected the number of error bits within one page read out data (step S6). Further, a permissible value data is input from the external of the chip (step S7). With this data, it is detected whether the number of the error bits is over the permissible value or not, and the judgment result is output outside of the chip (step S8).

Although, in the above-described embodiment, the memory chip has functions of counting the error bit number and judging thereof, these functions may be omitted from the memory chip. In such the case, the test mode operation flow corresponding to that shown in FIG. 8 may be expressed as FIG. 9.

Figure 9:
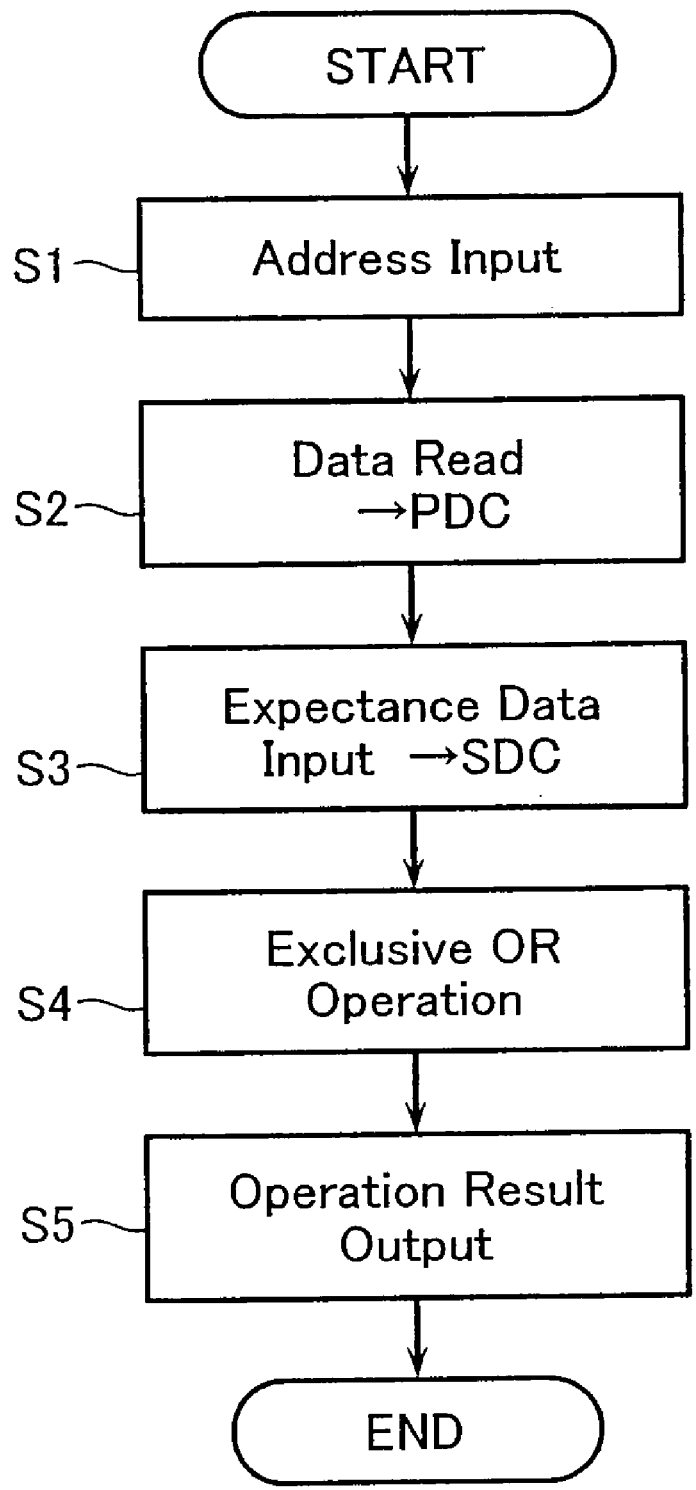
FIG. 9 shows another operation flow of detecting error bits.

In FIG. 9, from the start to the step S4, in which exclusive OR operation is performed, it is the same as in FIG. 8. Thereafter, the operation result obtained at data latch SDC is output outside of the chip as it is (step S5), and the test mode in the memory chip ends. The operation result data is expressed in such a way that error bit is "1" while normal bit is "0". Based on this operation result, the external controller may detect easily the error bit numbers.

In the above-described embodiment, when the operation result of the error bit detection is obtained in data latch SDC, the expectance data supplied from the external is held at the storage node DDCB in the write back circuit 25. If it is need of successively performing error bit number detection for another page with the same expectance data, without resetting the sense unit, it should be performed as follows: transfer the expectance data at the node DDCB to the node SDC of data latch 23 via data node TDC; read out new page data from the cell array to the node SDC of data latch 22; and then perform exclusive OR operation as similar to the above-describe embodiment.

According to this embodiment, it is able to shorten the error detection time in comparison with such a case that the expectance data is loaded from the external for each test page because one page data transferring in the sense units may be simultaneously performed in parallel.

In the above-described embodiment, error detection is performed with exclusive OR operation processing between read data and externally supplied expectance data in the sense amplifier circuit.

By contrast, it is useful that the expectance data is preliminarily written in the memory cell array. With this scheme, error detection may be performed with exclusive OR operation processing between read data from a first area of the cell array and the expectance data read out from a second area of the cell array in the sense amplifier circuit.

Figure 10:
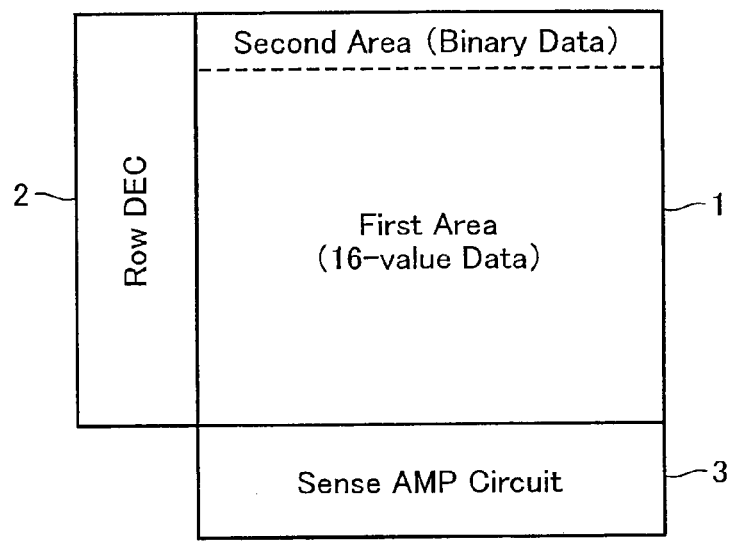
FIG. 10 shows data areas of the memory cell array in accordance with another embodiment.

For example, as shown in FIG. 10, the second area is prepared in the cell array 1 for storing binary data in addition to the first area in which 16-value data (or other multi-level data) are stored. In the second area, expectance data may be stored as binary data for error-detecting of multi-level page data. Since it may be taken a large data margin in binary data scheme in comparison with the multi-level data scheme, the reliability of the expectance data becomes higher, and the precision of the error detection becomes higher.

Figure 11:
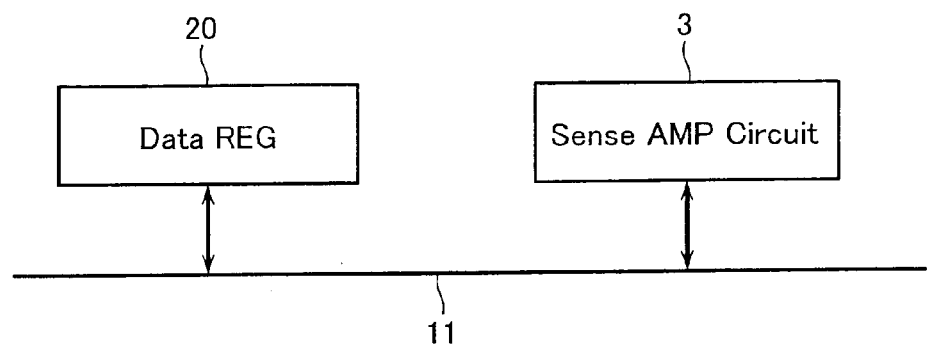
FIG. 11 shows a relationship between a data register and the sense amplifier circuit in accordance with still another embodiment.

Further, in the above-described embodiment, the read data and the expectance data are simultaneously stored in the sense amplifier circuit, and exclusive OR operation is performed therebetween. By contrast, as shown in FIG. 11, a data register 20 may be prepared for storing 1 page expectance data in addition to the sense amplifier circuit 3. In this case, the exclusive OR operation will be performed between one page the read data in the sense amplifier circuit 3 and one page expectance data stored in the data register 20 in a lump.

As an embodiment, an electric card using the non-volatile semiconductor memory devices according to the above-described embodiments of the present invention and an electric device using the card will be described bellow.

Figure 12:
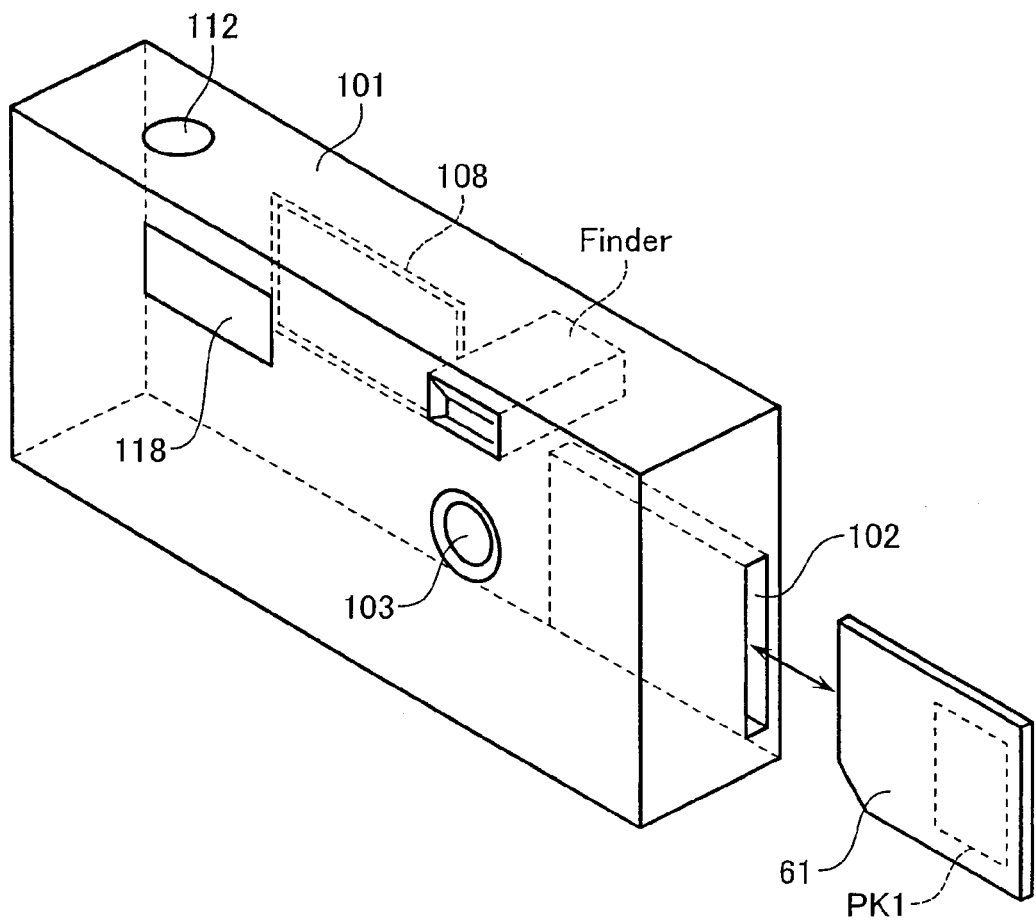
FIG. 12 shows another embodiment applied to a digital still camera.

FIG. 12 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 13:
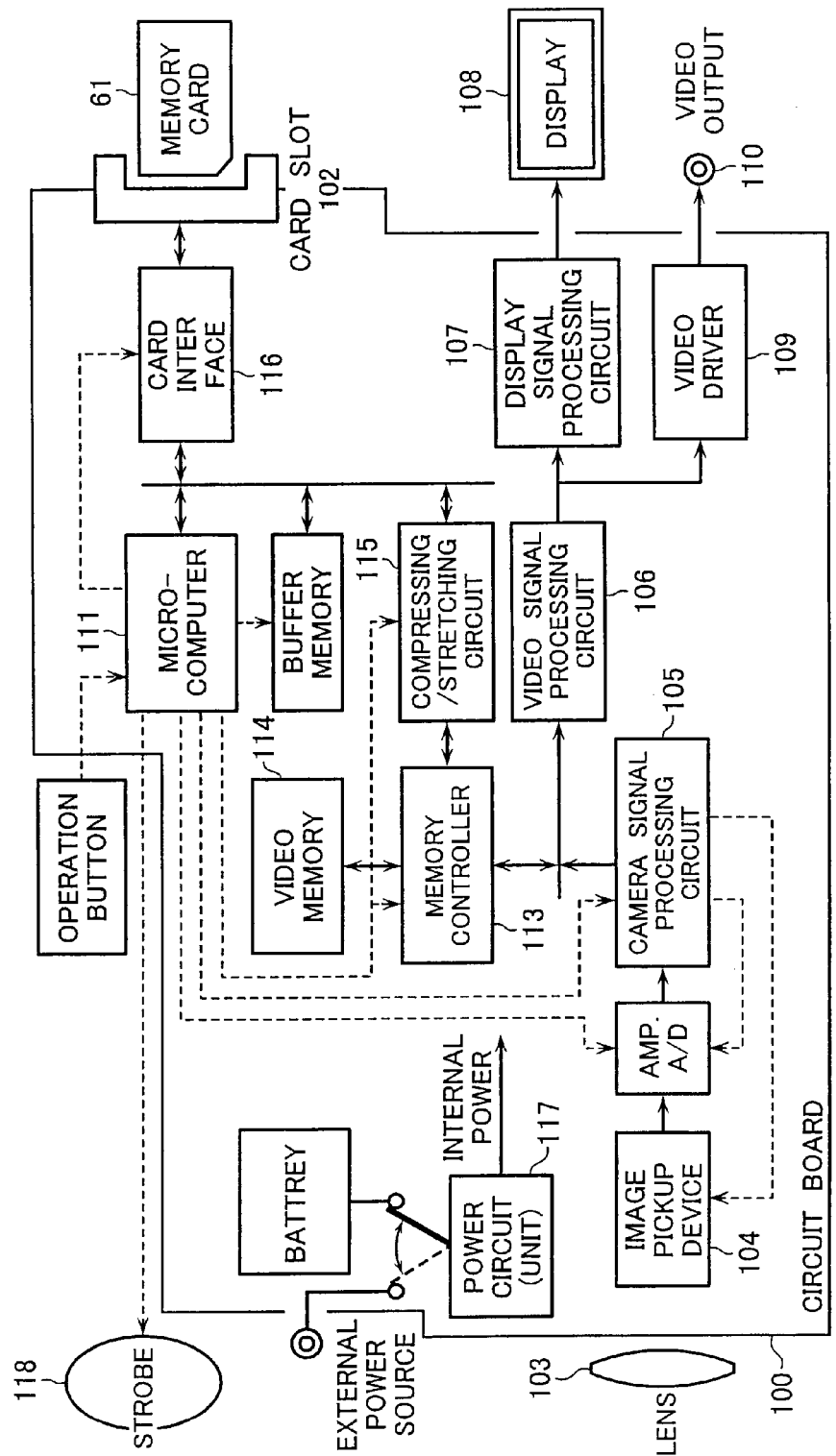
FIG. 13 shows the internal configuration of the digital still camera.
Figure 14A:
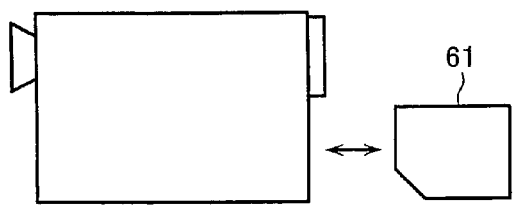
FIGS. 14A to 14J show other electric devices to which the embodiment is applied.
Figure 14F:
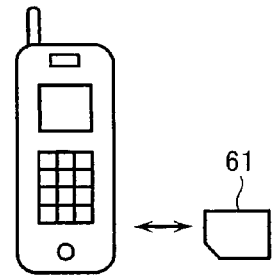
Figure 14B:
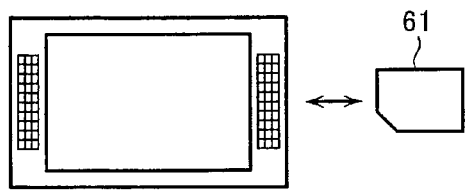
Figure 14G:
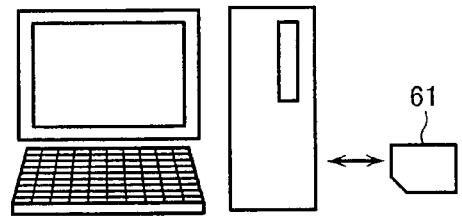
Figure 14C:
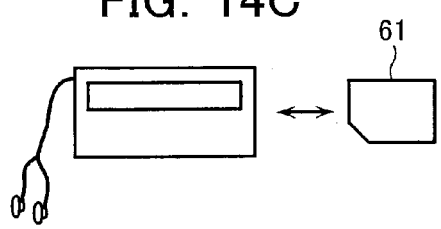
Figure 14H:
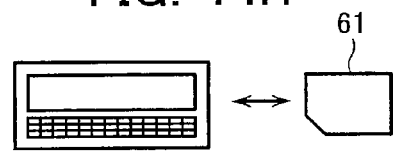
Figure 14D:
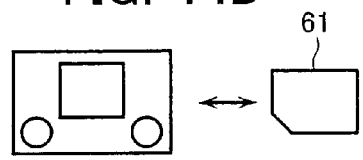
Figure 14I:
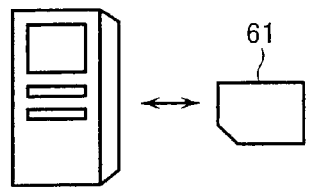
Figure 14E:
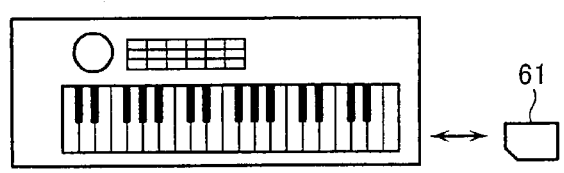
Figure 14J:
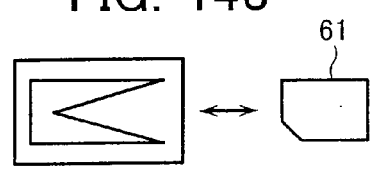

FIG. 13 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 14A to 14J, as well as in portable electric devices. That is, the electric card can also be used in a video camera shown in FIG. 14A, a television set shown in FIG. 14B, an audio apparatus shown in FIG. 14C, a game apparatus shown in FIG. 14D, an electric musical instrument shown in FIG. 14E, a cell phone shown in FIG. 14F, a personal computer shown in FIG. 14G, a personal digital assistant (PDA) shown in FIG. 14H, a voice recorder shown in FIG. 14I, and a PC card shown in FIG. 14J.

This invention is not limited to the above-described embodiment. It will be understood by those skilled in the art that various changes in form and detail may be made without departing from the spirit, scope, and teaching of the invention.

What is claimed is:

1. A semiconductor memory device comprising:
   a memory cell array having a plurality of memory cells arranged therein, each of the memory cells capable of being connected to a bit line for data read or data write;
   a sense amplifier circuit configured to read data of the memory cell array via the bit line; and
   a controller configured to control the sense amplifier circuit, the sense amplifier circuit further comprising:
a clamp transistor connected between the bit line and a first node to transfer a voltage of the bit line to the first node;
a first latch circuit capable of being connected to the first node to store data in a second node;
a second latch circuit capable of being connected between the first node and a data line for inputting/outputting data, to store data in a third node;
a first write-back circuit having a fourth node and configured to write back data stored in the second node to the first node via the fourth node, and to perform data addition/subtraction between the first node and the fourth node; and
a second write-back circuit having a fifth node and configured to write back data stored in the second node to the first node via the fifth node, and to perform data addition/subtraction between the first node and the fifth node.

2. The semiconductor memory device according to claim 1, wherein
when an error check mode for checking whether data read from the memory cell via the bit line is in conformity with externally supplied expectance data, the controller performs:
storing read data from the memory cell in the second node;
storing the expectance data in the third node;
transferring the read data from the second node to the fourth node;
transferring the expectance data from the third node to the first node;
transferring the expectance data from the first node to the second node;
conducting data subtraction between data stored in the first node and expectance data stored in the fourth node by activating the first write-back circuit to generate first subtraction data in the first node, and then transferring the first subtraction data to the second node;
transferring the expectance data from the second node to the fifth node;
transferring the fist subtraction data from the first node to the second node;
transferring the read data from the fourth node to the first node;
conducting data subtraction between data stored in the first node and expectance data stored in the fifth node by activating the second write-back circuit to generate second subtraction data in the first node;
transferring the first subtraction data stored in the second node to the fourth node; and
conducting data addition between the second subtraction data stored in the first node and the first subtraction data stored in the second node by activating the second write-back circuit to generate addition data in the first node.

3. The semiconductor memory device according to claim 1, wherein the sense amplifier circuit includes a plurality of sense units for storing page read data and page expectance data, and the page read data and the page expectance data are subjected to an error check mode for checking whether page read data is in conformity with the page expectance data in a lump in the sense amplifier circuit, the page read data being defined as a set of data bits, which are simultaneously read from plural memory cells.

4. The semiconductor memory device according to claim 3, further compnsing:
a counter configured to count the number of error bits in the result of error check mode performed between the page read data and the page expectance data; and
a comparator configured to compare the number of error bits obtained by the counter with an externally supplied permissible value, and output the compared resultant outside of the chip.

5. The semiconductor memory device according to claim 1, wherein the memory cell array include a plurality of NAND cell units arranged therein, each NAND cell unit having a plurality of electrically rewritable and non-volatile memory cells connected in series.

* * * * *